(12) United States Patent
Osaka

(10) Patent No.: US 11,698,589 B2
(45) Date of Patent: Jul. 11, 2023

(54) LIGHT SOURCE DEVICE, ILLUMINATING APPARATUS, EXPOSING APPARATUS, AND METHOD FOR MANUFACTURING ARTICLE

(71) Applicant: CANON KABUSHIKI KAISHA, Tokyo (JP)

(72) Inventor: Noboru Osaka, Habikino (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/031,647

(22) Filed: Sep. 24, 2020

(65) Prior Publication Data

US 2021/0096466 A1  Apr. 1, 2021

(30) Foreign Application Priority Data

Sep. 26, 2019 (JP) ................. 2019-176262

(51) Int. Cl.
*G03F 7/20* (2006.01)
*G03F 7/00* (2006.01)

(52) U.S. Cl.
CPC ............ *G03F 7/201* (2013.01); *G03F 7/2008* (2013.01); *G03F 7/7005* (2013.01); *G03F 7/70133* (2013.01)

(58) Field of Classification Search
CPC .... G03F 7/201; G03F 7/7005; G03F 7/70133; F21Y 2115/10; F21Y 2105/16; F21Y 2105/12
See application file for complete search history.

(56) References Cited

U.S. PATENT DOCUMENTS

| 2010/0220306 | A1* | 9/2010 | Malach | G03F 7/70075 |
| | | | | 355/70 |
| 2018/0128458 | A1* | 5/2018 | Fukasawa | F21V 19/0015 |
| 2020/0174377 | A1* | 6/2020 | Osaka | G03F 7/70075 |
| 2020/0248890 | A1* | 8/2020 | Osaka | G02B 3/0056 |

FOREIGN PATENT DOCUMENTS

| CN | 101907230 A | * | 12/2010 | |
| CN | 101907230 A | | 12/2010 | |
| JP | 2004228548 A | | 8/2004 | |
| JP | 2016200787 A | | 12/2016 | |
| JP | 2018022884 A | | 2/2018 | |
| KR | 2018106522 A | * | 10/2018 | ............... F21K 9/20 |
| TW | 200417825 A | | 9/2004 | |

* cited by examiner

*Primary Examiner* — Steven Whitesell Gordon
(74) *Attorney, Agent, or Firm* — Canon U.S.A., Inc. IP Division

(57) ABSTRACT

To uniformize the light intensity distribution on an irradiated surface in a light source device including a light-emitting diode (LED) array, a light source device includes a light-emitting diode (LED) array including a circuit having a substrate, a plurality of LED chips on the substrate, and a power supply. A predetermined plane is illuminated with light from the LED array. The plurality of LED chips includes first LED chips and second LED chips different from the first LED chips placed in a same column of the circuit, and the first LED chips have a placement angle different from a placement angle of the second LED chips.

11 Claims, 11 Drawing Sheets

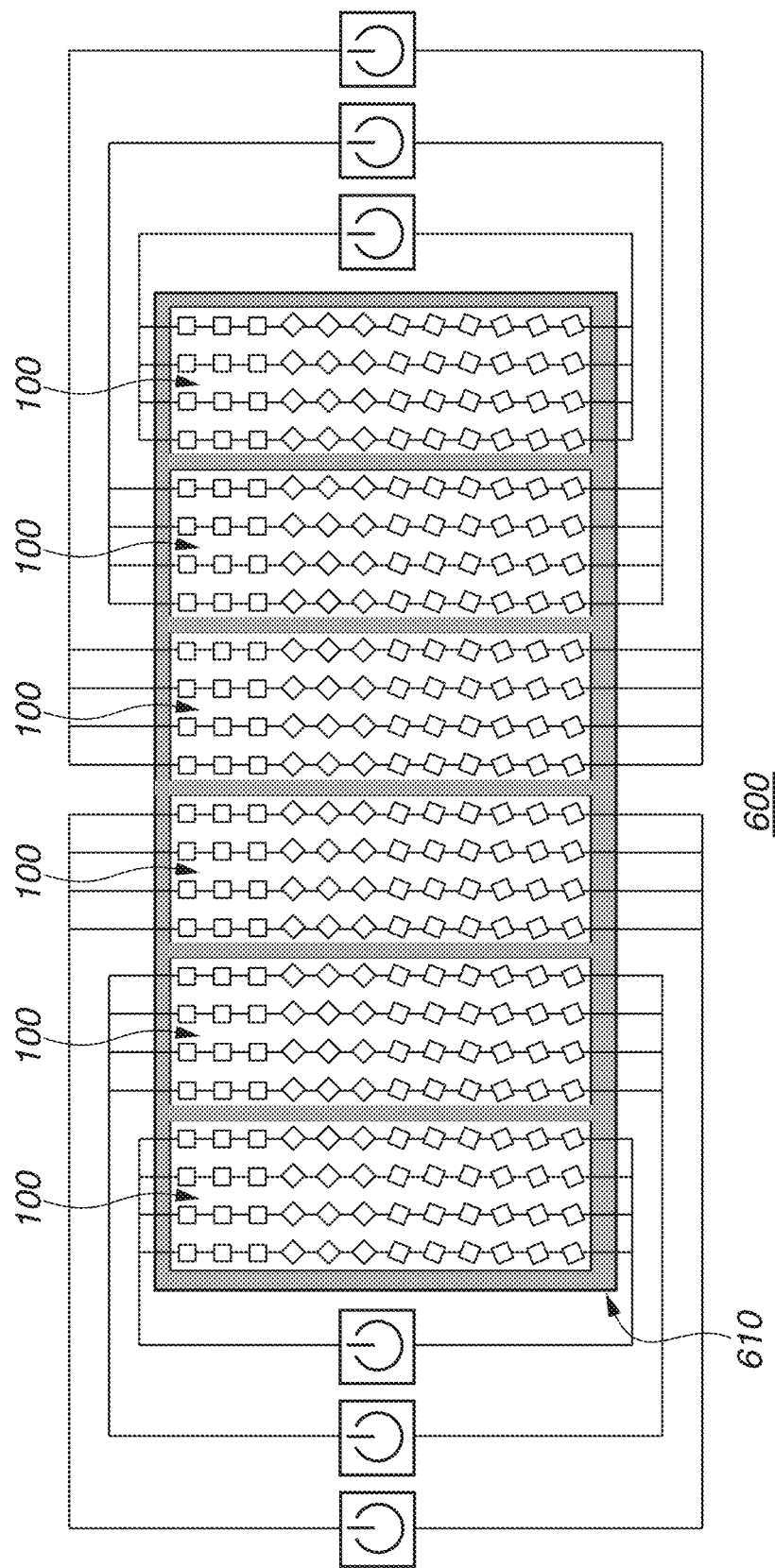

LIGHT SOURCE DEVICE, ILLUMINATING APPARATUS, EXPOSING APPARATUS, AND METHOD FOR MANUFACTURING ARTICLE

BACKGROUND

Field of the Disclosure

The present disclosure relates to a light source device, an illuminating apparatus, an exposing apparatus, and a method for manufacturing an article.

Description of the Related Art

In the process of manufacturing a semiconductor device or a flat panel display (FPD), an exposing apparatus is used. In a lithography process, the exposing apparatus transfers the pattern on an original (a reticle or a mask) onto a photosensitive substrate (a wafer or a glass plate with a resist layer formed on its surface) through a projecting optical system.

As a light source of a projection exposing apparatus, for example, a mercury lamp is used. In recent years, the replacement of the mercury lamp with a light-emitting diode (LED), which saves energy, is expected. In the LED, the time from when an electric current is applied to a substrate circuit that controls the emission of light from the LED to when the output of light becomes stable is short. Thus, the LED does not need to always emit light as in the mercury lamp, and therefore has a long life as well.

Light output per LED, however, is extremely smaller than that of the mercury lamp. In response, in a case where the LED is used as the light source instead of the mercury lamp, it is necessary to make the total output of light be large using an LED array in which a plurality of LEDs is aligned on a substrate.

Japanese Patent Application Laid-Open No. 2018-22884 discloses a light-emitting device using an LED as a light source and discloses a technique for differentiating the placement angles of a plurality of LED elements from each other, thereby making light and dark on an irradiated surface inconspicuous.

If the emission of light from an LED element stops in an LED array including a plurality of LED elements placed at the same placement angle in the same column, the optical characteristics on an irradiated surface may change. Japanese Patent Application Laid-Open No. 2018-22884 does not recognize such an issue and does not disclose a specific configuration of a substrate circuit that controls the emission of light from an LED.

SUMMARY OF THE INVENTION

The present disclosure is triggered by recognizing the issue that when a failure occurs in an LED element, the light and dark of light may occur on an irradiated surface. That is, if a failure occurs in an LED element included in an LED array, and the emission of light from the LED element stops, an electric current does not flow through LED elements placed in the same column as the LED element, and the emission of light from these LED elements also similarly stops.

As an aspect of the present invention for solving the above issue, a light source device includes a light-emitting diode (LED) array including a circuit having a substrate, a plurality of LED chips on the substrate, and a power supply, in which a predetermined plane is illuminated with light from the LED array, the plurality of LED chips including first LED chips and second LED chips different from the first LED chips placed in a same column of the circuit, the first LED chips have a placement angle different from a placement angle of the second LED chips.

Further features of the present invention will become apparent from the following description of exemplary embodiments with reference to the attached drawings.

BRIEF DESCRIPTION OF THE DRAWINGS

FIG. 3 is a plan view of an LED array unit according to the present invention.

DESCRIPTION OF THE EMBODIMENTS

Preferable exemplary embodiments of the present disclosure will be described in detail below based on the attached drawings.

Figure 1:
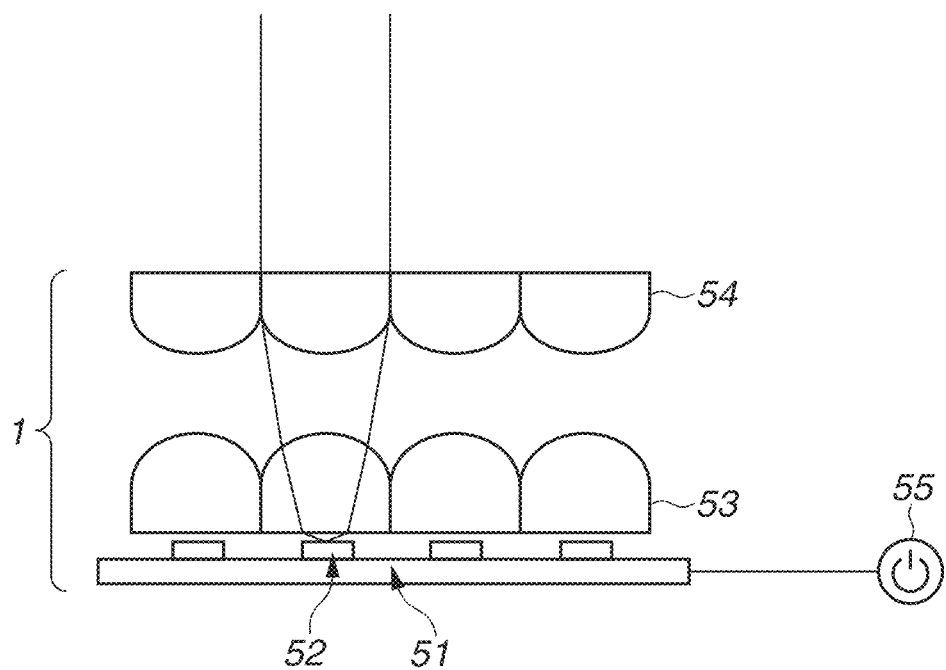
FIG. 1 is a schematic cross-sectional view of a light source unit according to the present invention.

With reference to FIG. 1, a light source unit (a light source device) 1 according to the present exemplary embodiment is described. FIG. 1 is a schematic cross-sectional view of the light source unit 1 according to the present exemplary embodiment. The light source unit 1 includes a substrate 51, light-emitting diode (LED) chips (LED elements) 52, condensing lenses 53 and 54, and a controlling unit 55. On the substrate 51, the plurality of LED chips 52 is placed and referred to as an "LED array unit". On the substrate 51, a circuit for driving the LED chips 52 is formed. If an electric current is applied to the circuit, each LED chip 52 outputs light with a predetermined wavelength. The controlling unit 55 includes a power supply and controls the electric current flowing through the LED chips 52, thereby controlling the luminances (intensities) of the light to be output from the LED chips 52.

The condensing lenses 53 and 54 are lens arrays including lenses provided corresponding to the LED chips 52. The lenses of the condensing lens 53 are provided on the respective LEDs. Each of the lenses provided in the condensing lenses 53 and 54 may be a plano-convex lens as illustrated in FIG. 1, or may have another shape with a power. As each of the lens arrays included in the condensing lenses 53 and 54, a lens array in which lenses are continuously formed by etching or cutting, or a lens array in which individual lenses are joined together can be used. Light emitted from each LED chip 52 spreads at a half angle of about 50° to 70°, but is converted to about 30° or less by the condensing lens 53 or 54. The condensing lens 53 may be provided with a predetermined distance away from the LED chips 52 and fixed integrally with the substrate 51.

Figure 2A:
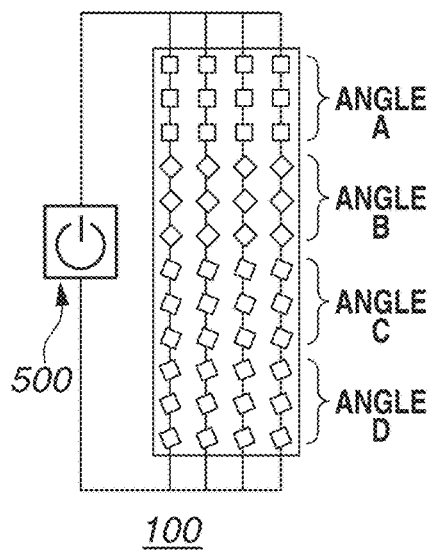
FIG. 2A is a plan view of a LED array according to the present invention.

Next, an LED array included in the light source unit 1 according to the present exemplary embodiment is described. FIG. 2A is a plan view of an LED array 100 according to the present exemplary embodiment. The LED array 100 includes twelve LED chips placed at an angle A, twelve LED chips placed at an angle B, twelve LED chips placed at an angle C, and twelve LED chips placed at an angle D on the substrate 51. The angle B is an angle inclined by 45° with respect to the angle A, and the angles C and D are angles inclined by ±22.5° with respect to the angle A. Hereinafter, the LED chips placed at the angle A will be referred to as "LED chips A", the LED chips placed at the angle B will be referred to as "LED chips B", the LED chips placed at the angle C will be referred to as "LED chips C", and the LED chips placed at the angle D will be referred to as "LED chips D". Each LED chip has a square shape.

The LED array 100 in FIG. 2A includes on a parallel circuit a plurality of chip columns including a plurality of LED chips. Specifically, four chip columns are formed, and each column includes three LED chips A, three LED chips B, three LED chips C, and three LED chips D.

Figure 2B:
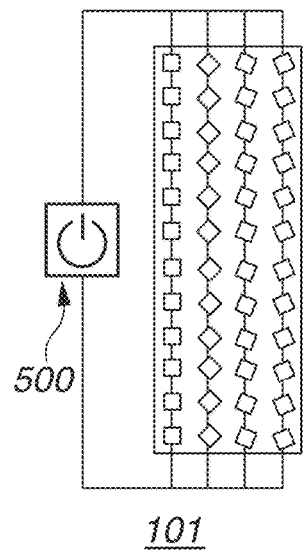
FIG. 2B is a plan view of an LED array as a comparative example.

FIG. 2B is a plan view of an LED array 101 as a comparative example. Also in FIG. 2B, four chip columns are formed. In a first column, twelve LED chips A are placed. In a second column, twelve LED chips B are placed. In a third column, twelve LED chips C are placed. In a fourth column, twelve LED chips D are placed.

In FIGS. 2A and 2B, a "chip column" means a plurality of LED chips placed in series in the same column of a parallel circuit. As will be described below with reference to FIG. 2E, a plurality of LED chips placed in series in a single series circuit also corresponds to a "chip column" according to the present exemplary embodiment. That is, a "chip column" means a plurality of LED chips placed electrically in series.

A state is considered where in the LED array 101 in FIG. 2B, a failure occurs in one of the LED chips A in the first column, and the emission of light from the LED chip A is stopped. At this time, a situation may occur where an electric current does not flow through the other LED chips A placed in the first column, and the emission of light from all the LED chips A placed in the first column stops. At this time, in the LED array 101, while the LED chips B, the LED chips C, and the LED chips D all emit light, the emission of light from all the LED chips A stops. This makes the light intensity distribution on an irradiated surface be non-uniform.

Next, the effects of the present invention are described in detail. A state is considered where in the LED array 100 according to the present exemplary embodiment, a failure occurs in one of the LED chips in a certain column, and the emission of light from the LED chip is stopped. At this time, a situation may occur where an electric current does not flow through the other LED chips placed in the same column, and the emission of light from all the LED chips placed in this column stops.

However, the other three columns that do not include the LED chip in which the failure occurs each include three LED chips A, three LED chips B, three LED chips C, and three LED chips D. Thus, although the light emission intensity of the entire LED array 100 decreases, the uniformity of the light intensity distribution on the irradiated surface is maintained.

Figure 2C:
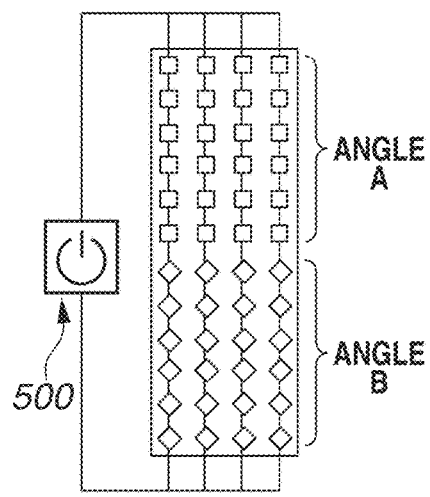
FIG. 2C is a plan view of an LED array according to the present invention.
Figure 2D:
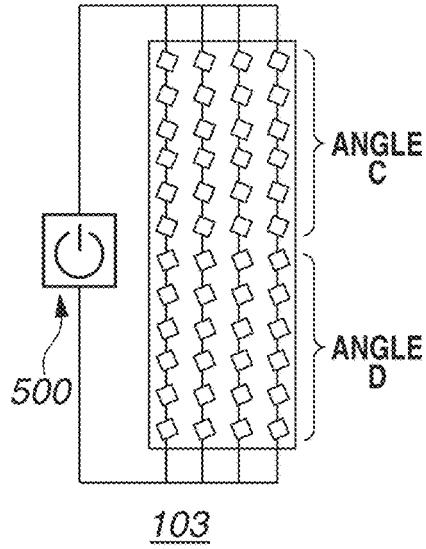
FIG. 2D is a plan view of an LED array according to the present invention.

The placement of LED chips is not limited to the placement illustrated in FIG. 2A, and may be any placement in which when a failure occurs in an LED chip, the uniformity of the light intensity distribution on the irradiated surface is maintained. For example, LED arrays may be configured as illustrated in FIGS. 2C and 2D. In an LED array 102 illustrated in FIG. 2C, four chip columns are formed, and each column includes six LED chips A and six LED chips B. In an LED array 103 illustrated in FIG. 2D, four chip columns are formed, and each column includes six LED chips C and six LED chips D.

As described above, the placement angles of a plurality of LED chips placed in each column included in a substrate circuit of an LED array are differentiated from each other, whereby it is possible to uniformize the light intensity distribution formed on the irradiated surface by the LED array. In the present exemplary embodiment, the placement angles of LED chips have two values or four values. The present invention, however, is not limited to this, and the number of the placement angles of LED chips may be increased.

Figure 2E:
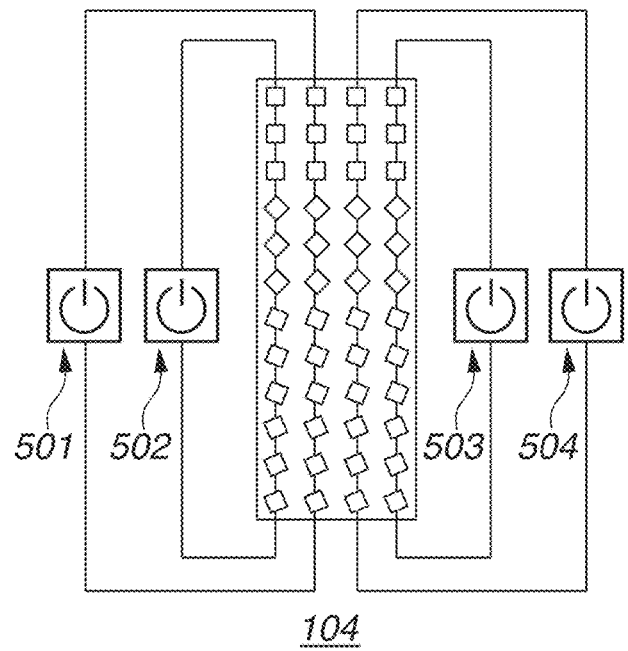
FIG. 2E is a plan view of an LED array according to the present invention.

FIG. 2E is a plan view of an LED array 104 including four series circuits. Controlling units (501 to 504) that control electric currents to be applied to the series circuits are provided for the respective series circuits. Each series circuit includes a chip column in which a plurality of LED chips is placed.

FIG. 3 is a plan view of an LED array unit 600 in which a plurality of LED arrays 100 according to the present exemplary embodiment is arranged. The LED arrays 100 are held by a holding mechanism 610. Controlling units are provided for the respective LED arrays 100. Electric currents to be applied to the LED arrays 100 are individually controlled by the respective controlling units.

Figure 4:
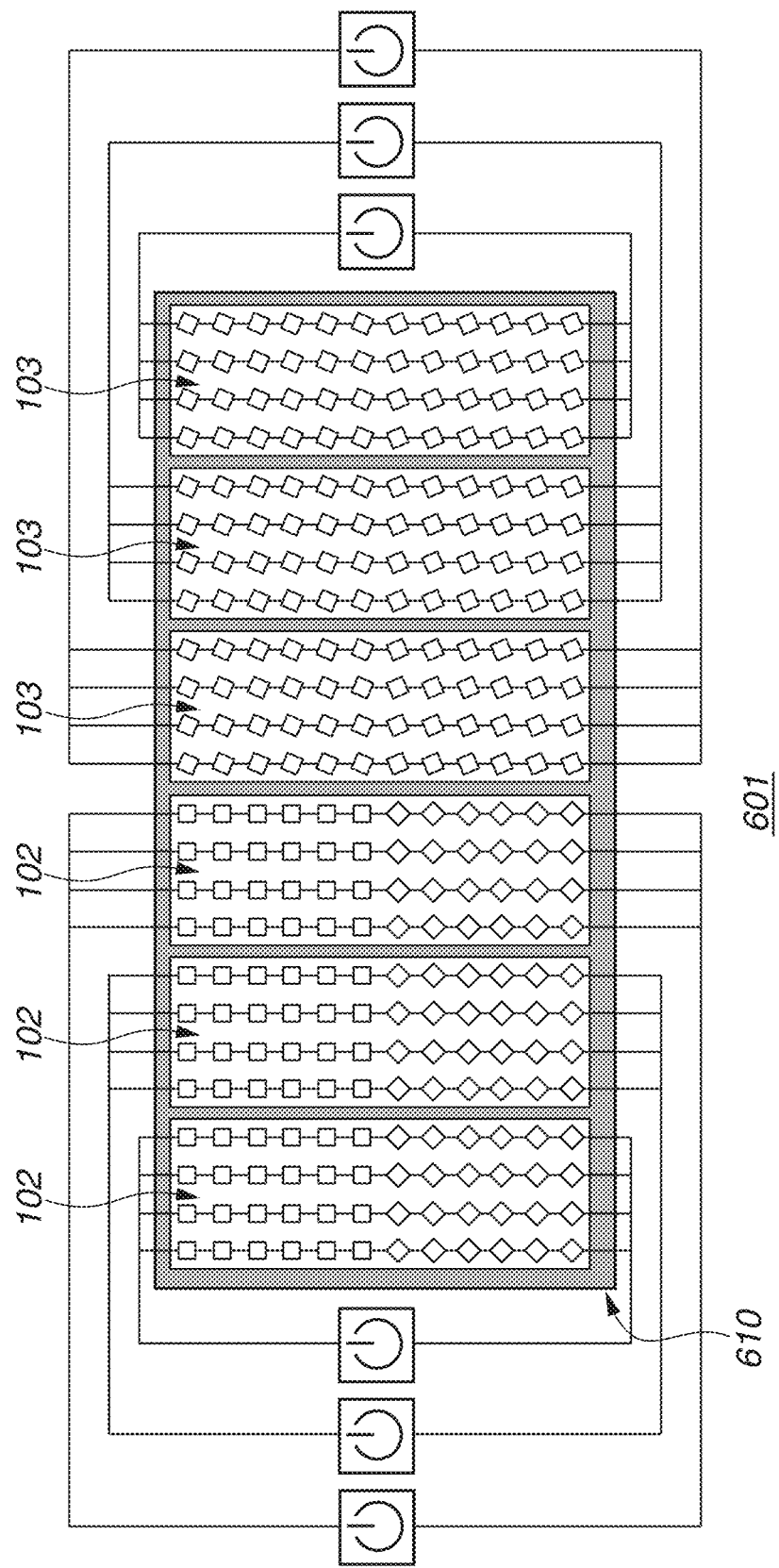
FIG. 4 is a plan view of an LED array unit according to the present invention.

FIG. 4 is a plan view of an LED array unit 601 in which a plurality of LED arrays 102 and a plurality of LED arrays 103 according to the present exemplary embodiment are arranged. Similarly to FIG. 3, controlling units are provided for the respective LED arrays. Electric currents to be applied to the LED arrays are individually controlled by the respective controlling units. An electric current to be applied to the LED array 102 and an electric current to be applied to the LED array 103 are separately controlled, whereby, as will be described below, it is possible to appropriately change the light intensity distribution formed on the irradiated surface by the LED array unit 601.

Figure 5:
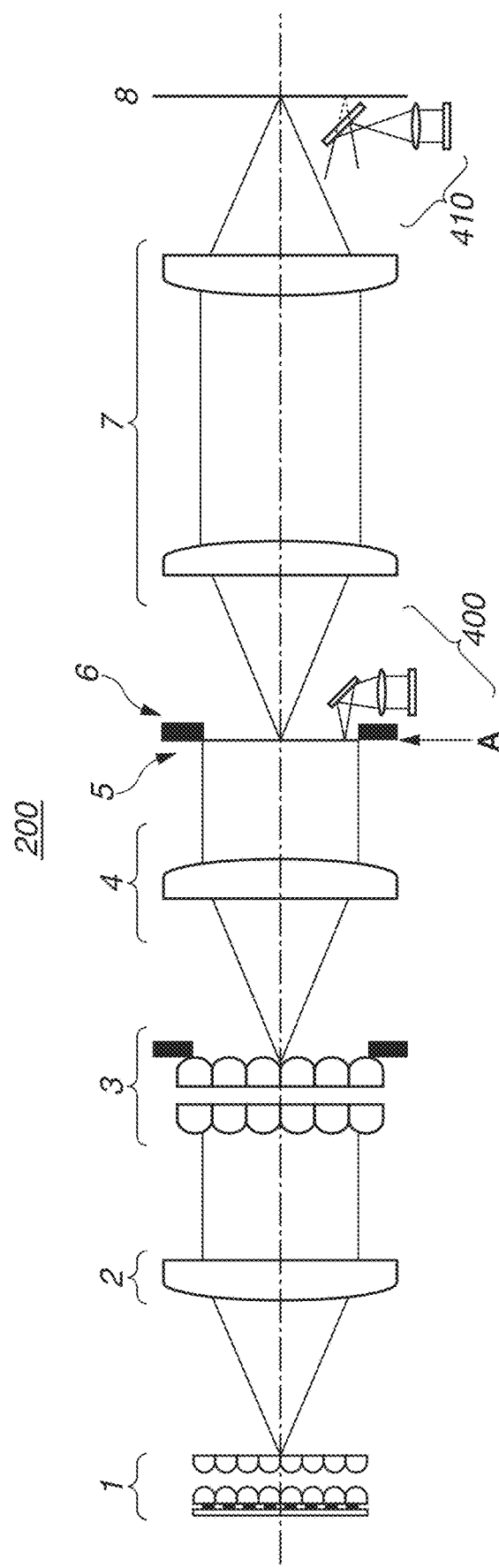
FIG. 5 is a schematic diagram of an illuminating optical system according to the present invention.

Next, with reference to FIG. 5, an example of an illuminating optical system (an illuminating apparatus) 200 according to the present exemplary embodiment is described. FIG. 5 is a schematic cross-sectional view of the illuminating optical system 200 according to the present exemplary embodiment. The illuminating optical system 200 includes the light source unit 1, a condensing lens 2, a fly-eye optical system 3, a condensing lens 4, a field stop 6, and an imaging optical system 7.

A light flux emitted from the light source unit 1 passes through the condensing lens 2 and reaches the fly-eye optical system 3. The condensing lens 2 is designed such that the position of the exit surface of the light source unit 1 and the position of the incident surface of the fly-eye optical system 3 are optically Fourier conjugate planes. Such an illuminating system is termed a Köhler illuminating system. Although a single plano-convex lens is illustrated as the condensing lens 2 in FIG. 5, actually, the condensing lens 2 is often formed by a plurality of lens units.

Figure 6:
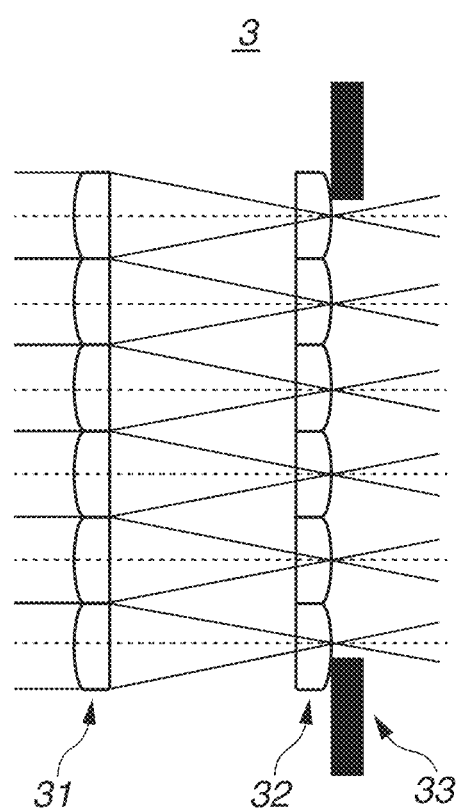
FIG. 6 is a schematic diagram of a fly's-eye optical system according to the present invention.

FIG. 6 illustrates a schematic cross-sectional view of the fly-eye optical system 3 according to the present exemplary embodiment. The fly-eye optical system 3 includes two lens groups 31 and 32 and an aperture stop 33. Each of the lens groups 31 and 32 is a lens group in which a plurality of plano-convex lenses is bonded together such that the edge surfaces of the plano-convex lenses are arranged in the same plane. The lens groups 31 and 32 are placed such that at the focal position of each plano-convex lens, a counterpart plano-convex lens is located. Using such a fly-eye optical system 3, at the position of the exit surface of the fly-eye optical system 3, a plurality of secondary light source images conjugate to the exit surface of the light source unit 1 is formed.

Figure 7:
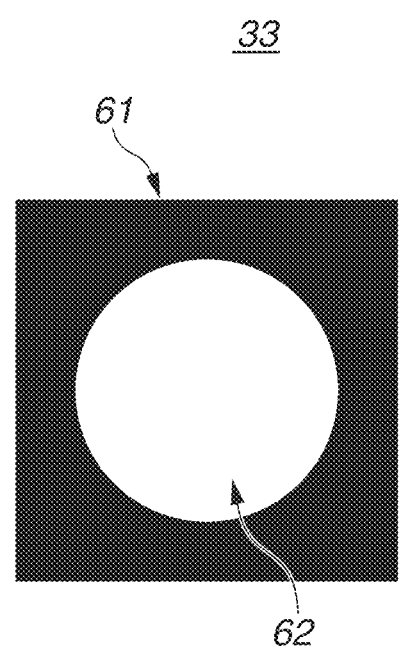
FIG. 7 is a diagram illustrating an aperture stop according to the present invention.

Near the lens groups 31 and 32 in the fly-eye optical system 3, the aperture stop 33 illustrated in FIG. 7 is formed. The aperture stop 33 includes a portion 62 (an aperture) that transmits light, and a portion 61 that blocks light. Light emitted from the exit surface of the fly-eye optical system 3 and passing through the light transmission portion 62 of the aperture stop 33 passes through the condensing lens 4 and reaches an illumination surface 5.

The condensing lens 4 is designed such that the exit surface of the fly-eye optical system 3 and the illumination surface 5 are optically Fourier conjugate planes. The exit surface of the fly-eye optical system 3 or the plane conjugate to the exit surface of the fly-eye optical system 3 is the pupil plane of the illuminating optical system 200. In this case, the intensity distributions of light from secondary light sources formed on the exit surface of the lens group 32 are summed up in a superimposed manner on the illumination surface 5 and thereby can form an almost uniform light intensity distribution.

The fly-eye optical system 3 has the function of uniformizing a light intensity distribution and is termed an optical integrator. Examples of the optical integrator include a microlens array and a fly-eye lens. As the optical integrator, a lens array in which lenses are continuously formed by etching and so on, or a lens array in which individual lenses are joined together can be used. Alternatively, an internal reflection-type optical integrator can also be used that reflects light from its incident end surface multiple times on its inner surfaces and emits light having a uniform light intensity distribution from its reflection end surface. Examples of the internal reflection-type optical integrator include an optical rod and an optical pipe.

Near the illumination surface 5, the field stop 6 is placed. A light flux emitted from an aperture portion of the field stop 6 is imaged on an illuminated surface 8 by the imaging optical system 7. The imaging optical system 7 has a desired magnification, and an illumination region cut out by the field stop 6 is projected onto the illuminated surface 8.

Figure 8A:
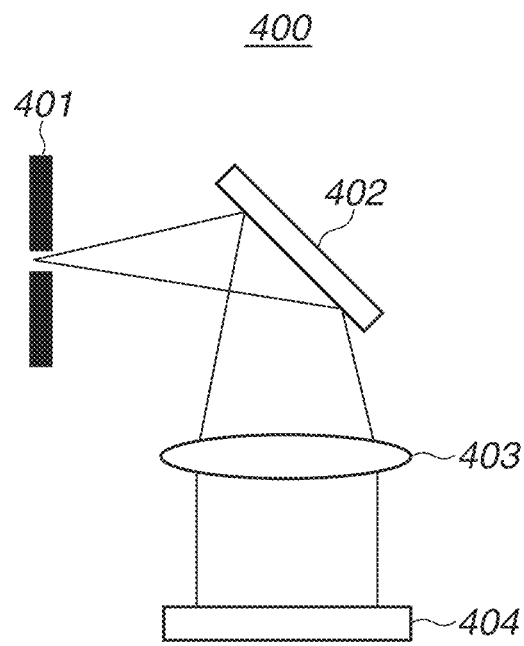
FIG. 8A is a schematic diagram of a measuring unit according to the present invention.

The illuminating optical system 200 includes a measuring unit (a measuring device) 400 that measures the light intensity distribution on the pupil plane (the effective light source distribution). The measuring unit 400 is placed in the optical path when performing measurements and measures the light intensity distribution on the pupil plane. FIG. 8A illustrates a schematic diagram of the measuring unit 400. The measuring unit 400 is placed on the rear side of the pupil plane (e.g., a plane A in FIG. 5) on which the intensity distribution is to be measured. Then, the measuring unit 400 detects a part of light fluxes incident on the plane A. Near the plane A, a pinhole plate 401 including a pinhole is placed, and a light flux emitted with a certain angle distribution from the pinhole plate 401 is bent by 90° by a deflecting mirror 402. Then, the light flux is refracted by a lens 403 having positive power and is converted into an almost parallel light flux. The almost parallel light flux is incident on a detecting unit 404 such as a charge-coupled device (CCD) camera. A light distribution detected by the detecting unit 404 is converted into an electric signal, and the electric signal is imported into a data processing apparatus such as a computer.

Figure 8B:
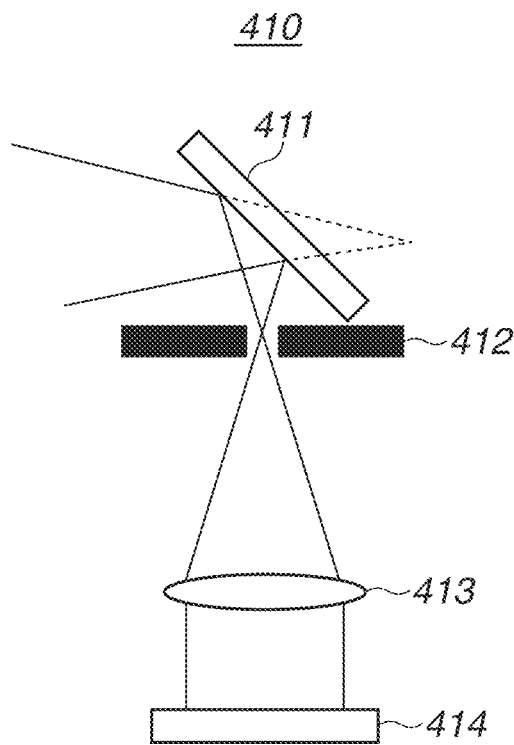
FIG. 8B is a schematic diagram of a measuring unit according to the present invention.

Alternatively, a measuring unit 410 that measures the light intensity distribution on the pupil plane may be placed on the front side of the illuminated surface 8 and detect a part of light fluxes incident on a plane B. FIG. 8B illustrates a schematic diagram of the measuring unit 410. A part of light fluxes to be incident on the illuminated surface 8 is bent by 90° by a deflecting mirror 411 before being incident on the illuminated surface 8. At an optical path length position corresponding to the illuminated surface 8 in a case where the light flux is not bent, a pinhole plate 412 having a pinhole is placed. A light flux emitted with a certain angle distribution from the pinhole plate 412 is refracted by a lens 413 having positive power and is converted into an almost parallel light flux. The almost parallel light flux is incident on a detecting unit 414 such as a CCD camera.

The measuring units 400 and 410 are measuring units different in the configurations of the optical elements but based on essentially the same principles as each other. If the distances between the pinholes and the CCD surfaces are extremely larger than the diameters of the pinholes, the lenses 403 and 413 can be omitted.

Figure 9B:
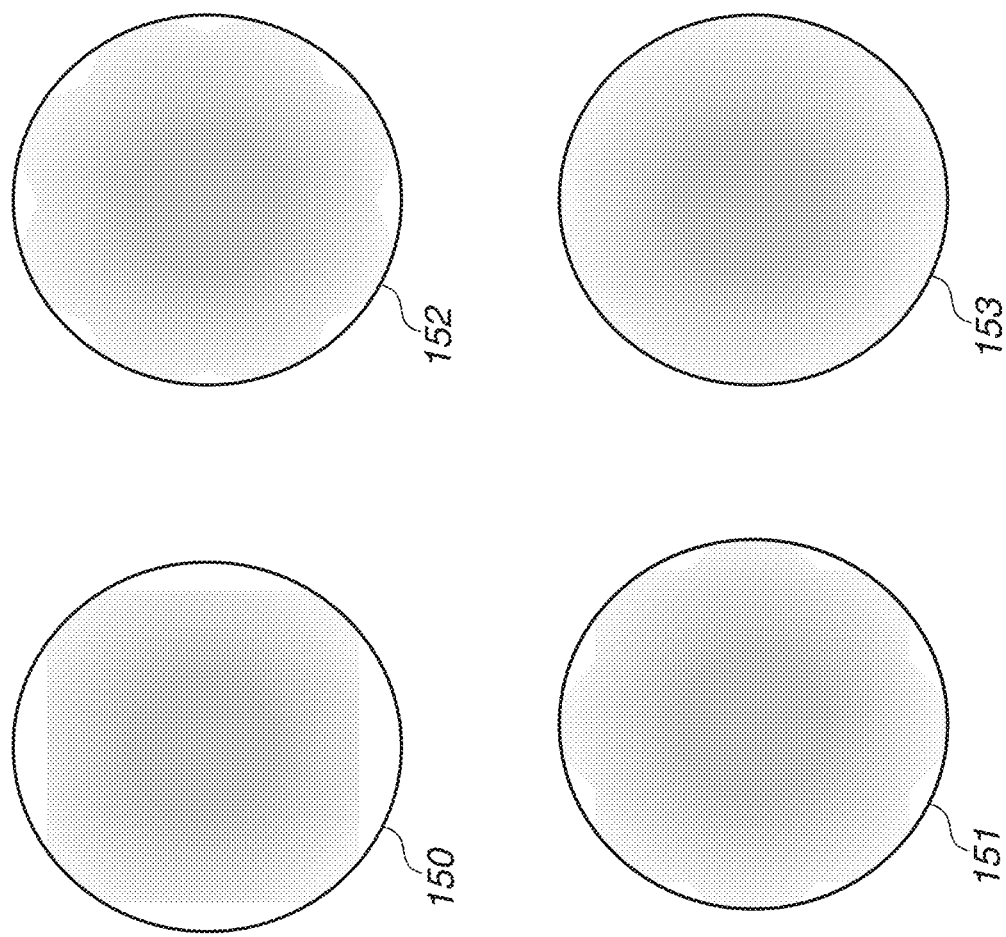
FIG. 9B is a diagram illustrating a light intensity distribution on a pupil plane according to the present invention.
Figure 9A:
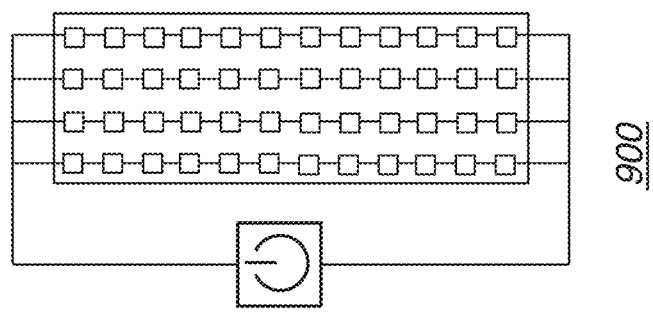
FIG. 9A is a plan view of an LED array as a comparative example.

Next, the light intensity distribution formed on the irradiated surface by an LED array is described. In a case where an LED array 900 illustrated in FIG. 9A is configured as the light source unit 1, the light intensity distribution becomes a distribution 150 illustrated in FIG. 9B. In FIG. 9B, a circle indicated by a solid line is a circle corresponding to the effective diameter of the pupil plane of the illuminating optical system 200. That is, an intensity distribution inside this circle corresponds to an angle distribution with which a certain point in the illuminated surface 8 is illuminated. In the distribution 150, the intensity is larger in diagonal directions in the pupil plane than in vertical and horizontal directions in the pupil plane, and a difference in intensity occurs between directions (azimuth directions or orientations). This is because the LED chips have square shapes, so that the outer shapes of the LED chips are partially projected. The intensity in the vertical and horizontal directions decreases in portions corresponding to the outside of the sides of the LED chips, but the intensity in 45° diagonal directions is maintained to some extent up to portions corresponding to the corners of the LED chips.

In a case where the LED array 102 illustrated in FIG. 2C is configured as the light source unit 1, the light intensity distribution becomes a distribution 151 illustrated in FIG. 9B. The distribution 151 is a light intensity distribution obtained by combining light from the LED chips A and light from the LED chips B. The placement angles of LED chips are thus differentiated from each other, whereby it is possible to make the difference (deviation) in intensity between the vertical and horizontal directions and the diagonal directions be smaller in the distribution 151 than in the distribution 150.

In a case where the LED array 103 illustrated in FIG. 2D is configured as the light source unit 1, the light intensity distribution on the pupil plane becomes a distribution 152 illustrated in FIG. 9B. The distribution 152 is a light intensity distribution obtained by combining light from the LED chips C and light from the LED chips D.

In a case where the LED array 100 illustrated in FIG. 2A is configured as the light source unit 1, the light intensity distribution becomes a distribution 153 illustrated in FIG. 9B. The distribution 153 is a light intensity distribution obtained by combining light from the LED chips A, the LED chips B, the LED chips C, and the LED chips D. Thus, it is understood that a light intensity distribution more uniform than the distributions 151 and 152 is obtained.

The light source device and the illuminating optical system as described above can be applied to various illuminating apparatuses, and can also be used for an apparatus that illuminates a photocurable resin, an apparatus that illuminates and examines an object to be examined, or a lithography apparatus. For example, the light source device and the illuminating optical system can be applied to an exposing apparatus that exposes the pattern of a mask on a substrate, a maskless exposing apparatus, an imprint apparatus that forms a pattern on a substrate using a mold, or a planarized layer forming apparatus.

Figure 10:
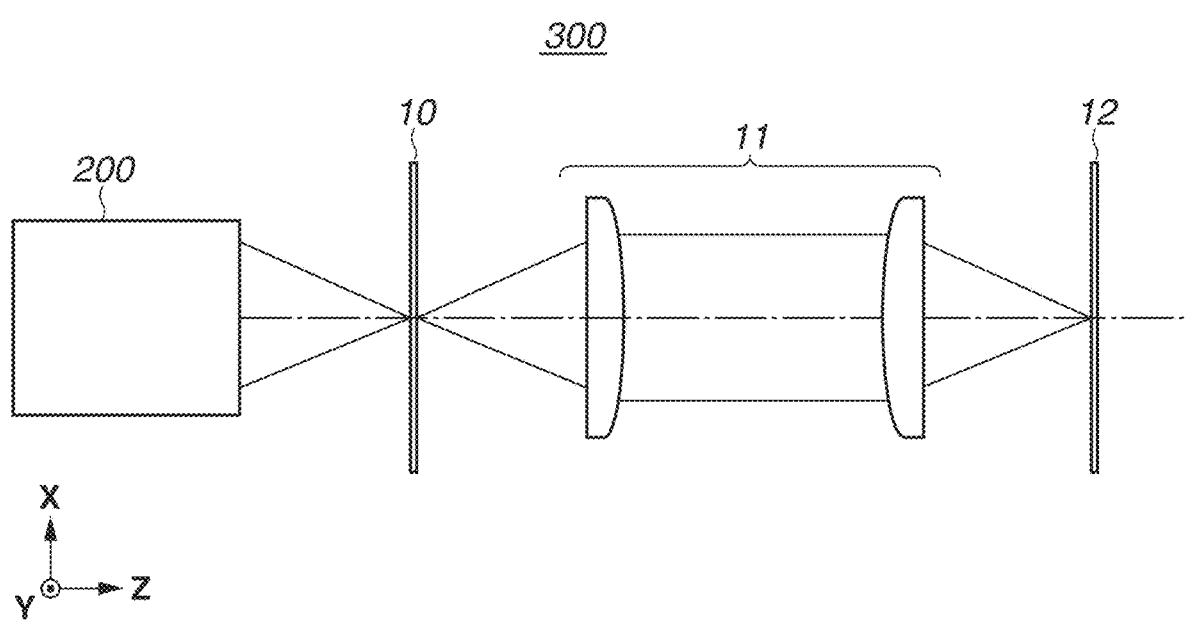
FIG. 10 is a schematic diagram of an exposing apparatus according to the present invention.

Next, with reference to FIG. 10, an example of an exposing apparatus 300 according to the present exemplary embodiment is described. FIG. 10 illustrates a schematic diagram of the exposing apparatus 300 according to the present exemplary embodiment. The exposing apparatus 300 includes the illuminating optical system 200 that illuminates a photomask 10, and a projecting optical system 11 that projects the pattern of the photomask 10 onto a wafer 12. The projecting optical system 11 may be a projecting lens consisting of lenses, or may be a reflective projecting system using a mirror. Although not illustrated in FIG. 10, stages that hold and drive the photomask 10 and the wafer (substrate) 12 are used.

Near the illuminated surface of the illuminating optical system 200 (an exposing unit), the photomask 10 is placed. On the photomask 10, a minute pattern is formed by a metal film such as chromium. Illuminating light emitted to the photomask 10 is diffracted according to the pattern of the photomask 10. The diffracted light is imaged on the wafer 12 by the projecting optical system 11 (an exposing unit).

In a case where LED arrays in which the placement angles of LED chips are differentiated from each other are used as the light source unit 1 of the illuminating optical system 200 as illustrated in FIG. 4, electric currents to be applied to the LED arrays are controlled, whereby it is possible to adjust the light intensity distribution formed on a predetermined plane by the light source unit 1. Generally, it is desirable that the light intensity distribution on the pupil plane is to be rotationally symmetrical and uniform in the plane. For the following reason, however, it may be necessary to adjust the light intensity distribution on the pupil of the illuminating optical system 200.

The reason is described. The actual imaging performance of the exposing apparatus 300 may be affected by many influence factors other than the light intensity distribution on the pupil plane of the illuminating optical system 200. Examples of the influence factors include the aberration of the projecting optical system 11 and the light intensity distribution on the pupil plane of the projecting optical system 11, the influence of the vibration or the heat of the exposing apparatus 300, and the influence of an exposure process or the like. The imaging performance is determined by summing up these factors in a complex manner. In response, the light intensity distribution on the pupil plane of the illuminating optical system 200 is adjusted to a desired distribution, whereby it is possible to suppress a decrease in the imaging performance that occurs due to factors other than the light intensity distribution on the pupil plane of the illuminating optical system 200.

For example, in a case where there is a difference in line width between a vertical and horizontal pattern and a diagonal pattern exposed by the exposing apparatus 300, the light intensity distribution on the pupil plane of the illuminating optical system 200 is set to a distribution in which a difference in intensity occurs between the vertical and horizontal directions and the diagonal directions. Consequently, it is possible to correct the difference in line width between the vertical and horizontal pattern and the diagonal pattern that occurs due to factors other than the light intensity distribution on the pupil plane of the illuminating optical system 200, to reduce the difference in line width.

In the example of FIG. 4, the light intensity distribution of each LED array 102 becomes the distribution 151 illustrated in FIG. 9B, and the light intensity distribution of each LED array 103 becomes the distribution 152 illustrated in FIG. 9B. In response, electric currents to be applied to the LED arrays 102 and electric currents to be applied to the LED arrays 103 are individually controlled, whereby it is possible to adjust the light intensity distributions formed by the LED arrays 102 and 103.

Alternatively, a controlling unit of the illuminating optical system 200 may set a target intensity distribution, and based on an intensity distribution measured by the measuring unit 400 or 410, control the output of LEDs of an LED array such that the actual light intensity distribution on the pupil plane becomes the target intensity distribution.

The adjustment amount and the adjustment direction of the intensity distribution on the pupil plane may be determined by trial and error, repeating adjustments and the measurements of the pattern imaging characteristics, or may be determined by image simulation in view of the characteristics of a photosensitive material of the wafer 12 or other process conditions.

As described above, the placement angles of LED chips in the same circuit are appropriately set, whereby it is possible to obtain an LED array having a uniform light intensity distribution on the irradiated surface even in a case where the emission of light from a particular LED chip is stopped. By using a light source device including this LED array, it is possible to achieve the uniformization of the light intensity distribution on the irradiated surface.

Figure 11:
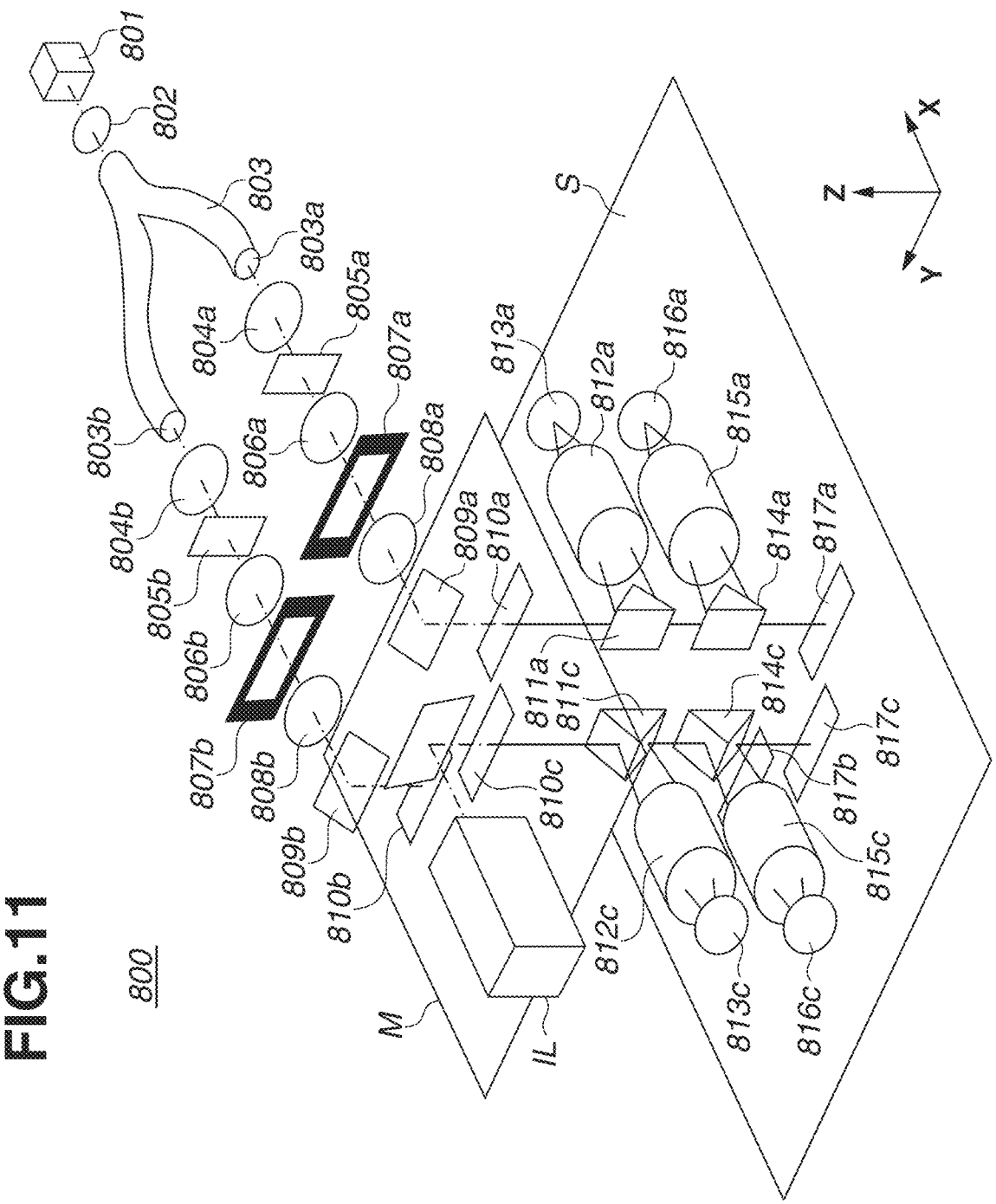
FIG. 11 is a diagram illustrating another example of the exposing apparatus according to the present invention.

FIG. 11 illustrates an exposing apparatus 800 according to another example of the present exemplary embodiment. The exposing apparatus 800 in FIG. 11 includes illuminating optical systems that illuminate a mask M, and a projecting optical system that projects the pattern of the mask M onto a substrate S. The mask M is movably held by a mask stage, and the substrate S is movably held by a substrate stage.

Using light from a light source 801, the illuminating optical systems form on the mask M a plurality of illuminated regions 810*a*, 810*b*, and 810*c* arranged along a Y-direction.

As the light source 801, the light source unit 1 including the LED arrays described above can be applied. Light from the light source 801 passes through a lens 802 and is incident on the entrance end of a light guide 803. The light guide 803 is formed by randomly bundled optical fibers and forms a uniform light intensity distribution at each of its exit ends 803a and 803b. A light flux emitted from the exit end 803a of the light guide 803 passes through a relay lens 804a and is incident on a fly-eye lens 805a. On the exit surface side of the fly-eye lens 805a, a plurality of secondary light sources is formed.

Light from the plurality of secondary light sources passes through a condensing lens 806a provided such that its front focal point is located at the positions where the secondary light sources are formed. Then, the light uniformly illuminates a field stop 807a including a rectangular aperture portion. The light from the aperture portion of the field stop 807a passes through a relay optical system 808a, the optical path thereof is deflected by 90 degrees by a mirror 809a, and the light illuminates the mask M. The relay optical system 808a is an optical system that optically conjugates the field stop 807a and the mask M to each other. The relay optical system 808a forms the illuminated region 810a that is an image of the aperture portion of the field stop 807a.

A light flux emitted from the exit end 803b of the light guide 803 passes through a relay lens 804b and is incident on a fly-eye lens 805b. On the exit surface side of the fly-eye lens 805b, a plurality of secondary light sources is formed. Light from the plurality of secondary light sources passes through a condensing lens 806b provided such that its front focal point is located at the positions where the secondary light sources are formed. Then, the light uniformly illuminates a field stop 807b including a rectangular aperture portion.

The light from the aperture portion of the field stop 807b passes through a relay optical system 808b, the optical path thereof is deflected by 90 degrees by a mirror 809b, and the light illuminates the mask M. The relay optical system 808b is an optical system that optically conjugates the field stop 807b and the mask M to each other. The relay optical system 808b forms the illuminated region 810b that is an image of the aperture portion of the field stop 807b.

An illuminating optical system IL that forms the illuminated region 810c can also be formed by an optical system similar to the above. The exit ends of the light guide 803 are provided corresponding to the number of illuminated regions, and illuminating light is supplied to these illuminated regions from the exit ends of the light guide 803 through the plurality of illuminating optical systems. The aperture portion of each field stop is not limited to a rectangular shape, and may have a trapezoidal or rhomboidal shape. The number of illuminated regions is not limited to three, and may be four or more.

Next, the projecting optical system is described. The projecting optical system includes projecting optical system modules corresponding to the number of illuminated regions to be formed by the illuminating optical systems and is formed by an optical system for an equal-magnification and erect image. The configurations of the projecting optical system modules are the same as each other. Each projecting optical system module has a configuration obtained by combining two Dyson optical systems (a first partial optical system and a second partial optical system).

Each partial optical system includes a right angle prism having a reflective surface placed at an inclination of 45° facing the mask M, a lens unit having an optical axis along the in-plane direction of the mask M, and a spherical mirror that reflects light passing through the lens unit.

The optical path of light from the illuminated region 810a passing through the mask M is deflected by 90° by a right angle prism 811a, and the light is incident on a lens unit 812a. The light from the right angle prism 811a is refracted by the lens unit 812a and reaches and is reflected by a spherical mirror 813a. The reflected light passes through the lens unit 812a and reaches the right angle prism 811a. The optical path of the light from the lens unit 812a is deflected by 90° by the right angle prism 811a, and the light forms a primary image of the mask M on the exit surface side of the right angle prism 811a. The primary image of the mask M formed by the first partial optical system at this time is an equal-magnification image with a positive lateral magnification in an X-direction and a negative lateral magnification in the Y-direction.

Light from the primary image passes through the second partial optical system and forms a secondary image of the mask M on the surface of the substrate S. The configuration of the second partial optical system is the same as that of the first partial optical system. The optical path of the light from the primary image is deflected by 90° by a right angle prism 814a, and the light is incident on a lens unit 815a. The light from the right angle prism 814a is refracted by the lens unit 815a and reaches and is reflected by a spherical mirror 816a. The reflected light passes through the lens unit 815a and reaches the right angle prism 814a.

The optical path of the light from the lens unit 815a is deflected by 90° by the right angle prism 814a, and the light forms a secondary image of the mask M on the exit surface side of the right angle prism 814a. Similarly to the first partial optical system, the second partial optical system forms an equal-magnification image with a positive lateral magnification in the X-direction and a negative lateral magnification in the Y-direction. Thus, the secondary image formed on the substrate S is an equal-magnification and erect image of the mask M, and an exposed region 817a is formed.

Also regarding the illuminated region 810c, similarly, the optical path of light is deflected by 90° by a right angle prism 811c, and the light is incident on a lens unit 812c. The light from the right angle prism 811c is refracted by the lens unit 812c and reaches and is reflected by a spherical mirror 813c. The reflected light passes through the lens unit 812c and reaches the right angle prism 811c. The optical path of the light from the lens unit 812c is deflected by 90° by the right angle prism 811c, and the light forms a primary image of the mask M on the exit surface side of the right angle prism 811c. Then, the optical path of the light from the primary image is deflected by 90° by a right angle prism 814c, and the light is incident on a lens unit 815c.

The light from the right angle prism 814c is refracted by the lens unit 815c and reaches and is reflected by a spherical mirror 816c. The reflected light passes through the lens unit 815c and reaches the right angle prism 814c. The optical path of the light from the lens unit 815c is deflected by 90° by the right angle prism 814c, and the light forms a secondary image of the mask M on the exit surface side of the right angle prism 814c. An exposed region 817c is formed on the substrate S.

Also regarding the illumination region 810b, an image is projected onto the substrate S by a projecting optical system module having a similar configuration, and an exposed region 817b is formed on the substrate S. Consequently, the projecting optical system modules form on the substrate S the three exposed regions 817a, 817b, and 817c arranged along the Y-direction.

The exposing apparatus 800 moves the mask M and the substrate S relative to each other in the X-axis direction, thereby performing scanning exposure on the substrate S. The substrate S is exposed by the exposed regions 817a, 817b, and 817c, and side end portions of the exposed regions 817a, 817b, and 817c overlap each other by the exposed regions 817a, 817b, and 817c. Thus, it is possible to expose the substrate S without space.

As the light source 801, the light source unit 1 including the LED arrays described above is applied, whereby it is possible to achieve the uniformization of the light intensity distribution on the irradiated surface.

(Method for Manufacturing Article)

Next, a description is given of a method for manufacturing an article (a semiconductor integrated circuit (IC) element, a liquid crystal display element, a color filter, or microelectromechanical systems (MEMS) or the like) using the exposing apparatus described above. The article is manufactured by, using the exposing apparatus described above, performing the step of exposing a substrate (a wafer or a glass substrate) on which a photosensitive material is applied, the step of developing the substrate (the photosensitive material), and the step of processing the developed substrate in other known processing steps. The other known steps include etching, resist removal, dicing, bonding, and packaging or the like. According to this manufacturing method, it is possible to manufacture a higher-grade article than a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-176262, filed Sep. 26, 2019, which is hereby incorporated by reference herein in its entirety.

What is claimed is:

1. A light source device comprising:
a light-emitting diode (LED) array including a substrate having circuits, a plurality of LED chips on the substrate, a first control unit, and a second control unit,
wherein the circuits include a first circuit and a second circuit,
wherein a predetermined plane is illuminated with light from the LED array,
wherein the first control unit controls an amount of an electric current applied to a first group including first LED chips and second LED chips arranged in series in the first circuit, the first LED chips have a first placement angle different from a second placement angle of the second LED chips,
wherein the second control unit controls an amount of an electric current applied to a second group including third LED chips and fourth LED chips arranged in series in the second circuit, the third LED chips have a third placement angle different from the first placement angle and the second placement angle, the fourth LED chips have a fourth placement angle different from the first placement angle, the second placement angle and the third placement angle,
wherein respective electric currents are flowed in the first circuit and the second circuit independently from each other, and
wherein the first control unit and the second control unit control the first circuit and the second circuit so as to make an intensity of light emitted from the LED chips in the first circuit and an intensity of light emitted from the LED chips in the second circuit different from each other, respectively, to adjust an illuminance distribution formed on the predetermined plane such that a difference in intensity is made between vertical and horizontal directions and diagonal directions.

2. The light source device according to claim 1,
wherein the circuits include a plurality of chip columns each having a plurality of LED chips placed thereon, and
wherein numbers of the LED chips placed in each chip column are equal to each other.

3. The light source device according to claim 1,
wherein the circuits include a plurality of chip columns each having a plurality of LED chips placed thereon, and
wherein a number of the first LED chips and a number of the second LED chips placed in each chip column are equal to each other.

4. The light source device according to claim 1,
wherein the circuits include a plurality of chip columns each having a plurality of LED chips are placed, the plurality of chip columns includes at least first chip columns and second chip columns different from the first chip columns; and
wherein a number of the first LED chips placed in a first chip column and a number of the first LED chips placed in the second chip column are equal to each other.

5. The light source device according to claim 4, wherein the number of the second LED chips placed in the first chip column and the number of the second LED chips placed in the second chip column are equal to each other.

6. The light source device according to claim 1, further comprising a lens array comprising a plurality of lenses each corresponding to one of the plurality of LED chips, respectively.

7. The light source device according to claim 1, wherein the first control unit and the second control unit control the electric current applied to the first group and the electric current applied to the second group, respectively, to change a light intensity distribution formed on the predetermined plane.

8. An illuminating apparatus comprising:
a light source device having an LED array, wherein the LED array includes a substrate having circuits, a plurality of LED chips placed on the substrate, a first control unit, and a second control unit, and wherein a predetermined plane is illuminated with light from the LED array;
a condensing lens; and
an optical integrator,
wherein the circuits include a first circuit and a second circuit,
wherein the first control unit controls an amount of an electric current applied to a first group including first LED chips and second LED chips arranged in series in the first circuit, the first LED chips have a first placement angle different from a second placement angle of the second LED chips,
wherein the second control unit controls an amount of an electric current applied to a second group including third LED chips and fourth LED chips arrangedin series in the second circuit, the third LED chips have a third placement angle different from the first placement angle and the second placement angle, the fourth LED chips have a fourth placement angle different from the first placement angle, the second placement angle and the third placement angle,
wherein respective electric currents are flowed in the first circuit and the second circuit independently from each other, wherein the first control unit and the second control unit control the first circuit and the second circuit so as to make an intensity of light emitted from the LED chips in the first circuit and an intensity of light emitted from the LED chips in the second circuit different from each other, respectively, to adjust an illuminance distribution formed on the predetermined plane such that a difference in intensity is made between vertical and horizontal directions and diagonal directions, and wherein light intensity distributions from the plurality of LED chips are superimposed on an incident surface of the optical integrator through the condensing lens.

9. The illuminating apparatus according to claim 8, wherein the optical integrator includes a lens group.

10. An exposing apparatus comprising:
an illuminating apparatus including a light source device with an LED array including circuits, a plurality of LED chips, a first control unit and a second control unit, a condensing lens, and an optical integrator, the light source device illuminating a mask with light from the LED array; and
an exposing unit configured to expose a pattern of the mask on a substrate,
wherein the circuits include a first circuit and a second circuit,
wherein the first control unit controls an amount of an electric current applied to a first group including first LED chips and second LED chips arranged in series in the first circuit, the first LED chips have a first placement angle different from a second placement angle of the second LED chips,
wherein the second control unit controls an amount of an electric current applied to a second group including third LED chips and fourth LED chips arranged in series in the second circuit, the third LED chips have a third placement angle different from the first placement angle and the second placement angle, the fourth LED chips have a fourth placement angle different from the first placement angle, the second placement angle and the third placement angle,
wherein respective electric currents are flowed in the first circuit and the second circuit independently from each other,
wherein the first control unit and the second control unit control the first circuit and the second circuit so as to make an intensity of light emitted from the LED chips in the first circuit and an intensity of light emitted from the LED chips in the second circuit different from each other, respectively, to adjust an illuminance distribution formed on the predetermined plane such that a difference in intensity is made between vertical and horizontal directions and diagonal directions, and wherein light intensity distributions from the plurality of LED chips of the light source device are superimposed on an incident surface of the optical integrator through the condensing lens.

11. A method for manufacturing an article, comprising:
exposing a substrate using an exposing apparatus; and developing the exposed substrate to obtain the article, wherein the exposing apparatus includes:
an illuminating apparatus including a light source device, a condensing lens, and an optical integrator, the light source device having an LED array including a substrate having circuits, a plurality of LED chips placed on the substrate, a first control unit and a second control unit, the light source device illuminating a mask with light from the LED array; and
an exposing unit configured to expose a pattern of the mask on the substrate,
wherein the circuits include a first circuit and a second circuit,
wherein the first control unit controls an amount of an electric current applied to a first group including first LED chips and second LED chips arranged in series in the first circuit, the first LED chips have a first placement angle different from a second placement angle of the second LED chips,
wherein the second control unit controls an amount of an electric current applied to a second group including third LED chips and fourth LED chips arranged in series in the second circuit, the third LED chips have a third placement angle different from the first placement angle and the second placement angle, the fourth LED chips have a fourth placement angle different from the first placement angle, the second placement angle and the third placement angle,
wherein respective electric currents are flowed in the first circuit and the second circuit independently from each other,
wherein light intensity distributions from the plurality of LED chips of the light source device are superimposed on an incident surface of the optical integrator through the condensing lens, and
wherein the first control unit and the second control unit control the first circuit and the second circuit so as to make an intensity of light emitted from the LED chips in the first circuit and an intensity of light emitted from the LED chips in the second circuit different from each other, respectively, to adjust an illuminance distribution formed on the predetermined plane such that a difference in intensity is made between vertical and horizontal directions and diagonal directions.

* * * * *